(12) United States Patent
Mei et al.

(10) Patent No.: US 10,903,763 B2
(45) Date of Patent: Jan. 26, 2021

(54) BUILT-IN PIEZOELECTRIC-TYPE ONLINE DYNAMIC BALANCE ACTUATOR

(71) Applicant: Xi'an Jiaotong University, Xi'an (CN)

(72) Inventors: Xuesong Mei, Xi'an (CN); Xialun Yun, Xi'an (CN); Gedong Jiang, Xi'an (CN); Jiachun Deng, Xi'an (CN); Tao Tao, Xi'an (CN); Muxun Xu, Xi'an (CN)

(*) Notice: Subject to any disclaimer, the term of this patent is extended or adjusted under 35 U.S.C. 154(b) by 84 days.

(21) Appl. No.: 16/471,956

(22) PCT Filed: Jul. 19, 2018

(86) PCT No.: PCT/CN2018/096227
§ 371 (c)(1),
(2) Date: Jun. 20, 2019

(87) PCT Pub. No.: WO2019/136956
PCT Pub. Date: Jul. 18, 2019

(65) Prior Publication Data
US 2020/0389102 A1   Dec. 10, 2020

(30) Foreign Application Priority Data

Jan. 9, 2018  (CN) .......................... 2018 1 0019499

(51) Int. Cl.
*H02N 2/12* (2006.01)
*H01L 41/04* (2006.01)

(52) U.S. Cl.
CPC ............. *H02N 2/12* (2013.01); *H01L 41/042* (2013.01)

(58) Field of Classification Search
CPC ........... H02N 2/10; H02N 2/12; H01L 41/042
(Continued)

(56) References Cited

U.S. PATENT DOCUMENTS

2010/0084946 A1* 4/2010 Park .................. H02N 2/08
                                                  310/323.03

FOREIGN PATENT DOCUMENTS

CN      103317446 A    9/2013
CN      108134537 A    6/2018
(Continued)

*Primary Examiner* — Derek J Rosenau
(74) *Attorney, Agent, or Firm* — Novoclaims Patent Services LLC; Mei Lin Wong

(57) ABSTRACT

A built-in piezoelectric type online dynamic balance actuator which includes two structurally identical left and right piezoelectric drive adjustment mechanisms at two sides of a housing. The piezoelectric drive adjustment mechanism includes a shaft having one end supported inside a housing chamber by bearing, a middle portion connected to an end cover by bearing, and the other end supported on bearing housing by bearing, a weight mass coupled to the shaft and positioned inside a tightening sleeve with one side connected to the bearing housing and another side connected to the end cover and the housing, and a stator fixedly connected to one side of the end cover, a mover pressed against a surface of the stator through a disk. Through a control center, the mass weights of the left and right piezoelectric drive adjustment mechanisms are fixed to a preset angle. As the main shaft rotates at a high speed, the two weight masses generate centrifugal force which combine to a balance vector to cancel the imbalance vector of the main shaft, improve the mass distribution of the main shaft and better fit the online dynamic balance requirements.

9 Claims, 3 Drawing Sheets

(58) Field of Classification Search
USPC .................................... 310/323.01–323.21
See application file for complete search history.

(56) References Cited

FOREIGN PATENT DOCUMENTS

CN    207753635 U    8/2018
JP     09273973 A   10/1997

* cited by examiner

BUILT-IN PIEZOELECTRIC-TYPE ONLINE DYNAMIC BALANCE ACTUATOR

BACKGROUND OF THE PRESENT INVENTION

Field of Invention

The present invention relates to the spindle balancing technology, and more particularly to a built-in piezoelectric-type online dynamic balance actuator.

Description of Related Arts

The high precision and high efficiency requirements of modern machining have placed high demands on CNC machine tools. As the core functional component of the machine tool, the spindle will directly affect the machining level of the machine tool. With the development of technology, online dynamic balance technology for quality correction through balancing terminals has been developed, and gradually achieved good results in the application process, which can better solve the problems of on-site dynamic balance technology. There are three main ways to realize the online suppression of spindle vibration by using the balancing terminal for mass redistribution: (1) Motor-driven type: this type uses a permanent magnet motor or a DC brushless motor to drive the mass block, and the weight mass can be moved along the mutually perpendicular axes fixed to the balancing terminal; (2) Electromagnetic force-driven: this type has also caused extensive research enthusiasm. The rotating ring of the device which contains the weight mass rotates with the rotor, and the permanent magnet is mounted on the rotating ring. During operation, the static ring fixed at the position of the spindle flange provides the electromagnetic force to drive the weight mass on the rotating ring to rotate, thereby changing the mass distribution in the balancing terminal; (3) External filling type: this type is mainly represented by a liquid spray type balancing terminal. The principle is to directly fill the mass liquid or other material from the outside to the specified position of the balancing terminal to change the mass of the rotor, thereby achieving the mass balancing of the spindle. In addition, in recent years, a new type of standing wave type piezoelectric actuator for online dynamic balancing has been developed.

However, the existing online balancing terminals have some limitations, especially in the field of high-speed grinding machines. First, the advantage of the motor-driven balancing terminal is that it is easy to implement, but since the brushless motor itself lacks self-locking capability and has a high rotational speed, it is necessary to add a self-locking mechanism and a speed reduction mechanism in the balancing terminal, which not only increases the complexity of the device, but also limits the transmission accuracy of the device. Second, the electromagnetic force-driven balancing terminal has a compact structure and high balance precision. Even after the spindle is stopped, the permanent magnet can maintain the balance state. However, the mechanical structure and control system are relatively complicated, the self-locking capability is also not high, the balance ability is relatively small, and when the temperature is too high, the permanent magnet is easily demagnetized and interfered by strong magnetic field. The third type is the external filling type which is represented by a liquid spray type balancing terminal. This type does not require the path optimization process of the weight mass block, does not need to transmit the driving control signal to the balancing terminal, and does not need to consider the self-locking factor, therefore the reliability of the balancing terminal is ensured and the balance ability is strong. However, its balance accuracy is affected by the combined effect of the shape of the cavity and the accuracy of the liquid beam control. In the high-precision balance, it is necessary to properly design the balance terminal structure and hydraulic system parameters, and there exists too many interference factors in industrial field applications. The last type standing wave type piezoelectric online dynamic balancing device avoids some of the above problems, but due to some problems in the structure of the existing standing wave type piezoelectric online dynamic balancing device, the standing wave type also has a serious problem of friction and wear. In addition, whether it is a grinding machine spindle or a high-speed cutting spindle, the shaft end needs to be equipped with a cutter or a grinding wheel. The end-type linear balancing device has a certain interference in the space for the normal operation of the machine tool.

SUMMARY OF THE PRESENT INVENTION

In order to overcome the problems of the existing technologies, an object of the present invention is to provide a built-in piezoelectric type online dynamic balance actuator to better meet the work requirements of online dynamic balance.

In order to achieve the above object, the present invention is implemented by the following technical solutions:

A built-in piezoelectric type online dynamic balance actuator, which includes a housing 40, the housing 40 has two sides connected to a left piezoelectric drive adjustment mechanism and a right piezoelectric drive adjustment mechanism, the left piezoelectric drive adjustment mechanism and the right piezoelectric drive adjustment mechanism have an identical structure and are completely symmetrical in structure;

the right piezoelectric drive adjustment mechanism comprises: a right shaft 3 having a front end of the right shaft 3 supported inside a right chamber of the housing 40 through a third bearing 11, a middle portion of the right shaft 3 connected to a right end cover 7 through a second bearing 12, and a rear end of the right shaft 3 supported on a right bearing housing 1 through a first bearing 2; a right weight mass 5 coupled to the right shaft 3 which is positioned between the right end cover 7 and the right bearing housing 1, the right weight mass 5 having one end secured into position by a shoulder of the right shaft 3 and another end secure into position by a right adjustment sleeve 4; the weight mass 5 is disposed inside a right tension sleeve 6, the right tension sleeve 6 has a right side connected to the right bearing housing 1 by bolt connection and a left side connected to the right end cover 7 and the housing 40 by bolt connection; a first stator 8 fixedly connected to a left side of the right end cover 7 by screw thread connection; and a first mover 9 pressed against a surface of the first stator 8 through a disk provided at the front end of the right shaft 3;

the left piezoelectric drive adjustment mechanism comprises: a left shaft 23 having a rear end of the left shaft 23 supported inside a left chamber of the housing 40 through a sixth bearing 31, a middle portion of the left shaft 23 connected to a left end cover 27 through a fifth bearing 32, and a front end of the left shaft 23 supported on a left bearing housing 21 through a fourth bearing 22; a left weight mass 25 coupled to the left shaft 23 which is positioned between the left end cover 27 and the left bearing housing 21, the left weight mass 25 having one end secured into position by a shoulder of the left shaft 23 and another end secure into position by a left adjustment sleeve 24; the weight mass 25 is disposed inside a left tension sleeve 26, the left tension sleeve 26 has a left side connected to the left bearing housing 21 by bolt connection and a right side connected to the left end cover 27 and the housing 40 by bolt connection; a second stator 28 fixedly connected to a right side of the left end cover 27 by screw thread connection; and a second mover 29 pressed against a surface of the second stator 28 through a disk provided at the rear end of the left shaft 23.

The vibration of the first stator 8 and the second stator 28 is generated by piezoelectric ceramic excitation, which is triggered by a two-phase excitation voltage of a control center, the right weight mass 5 and the left weight mass 25 are arranged to be driven by the control center to form a preset angle and then centrifugal force generated by the right weight 5 and the left weight 25 during high speed rotational movement of the main shaft combine to form a balance vector to cancel the imbalance vector of the main shaft so that mass distribution of the main shaft is improved.

The right shaft 3 and the left shaft 23 are provided with a shoulder 777 and a disc 888, the shoulder 777 is arranged for positioning one side of the right weight mass 5 and the left weight mass 25, the disc 888 is arranged for pressing against and applying preloading force to the first mover 9 and the second mover 29.

A first adjusting gasket 10 is disposed at a surface between the left shaft 3 and the third bearing 11 for adjustment of the preloading force, and a second adjusting gasket 30 is disposed at a surface between the right shaft 23 and the sixth bearing 31 for adjustment of the preloading force.

The right weight mass 5 and the left weight mass 25 has a semi-circular construction, and the right shaft 3 and the left shaft 23 are connected to the right weight mass 5 and the left weight mass 25 by a transition fit respectively, and a circumferential sliding of the right weight mass 5 and the left weight mass 25 are restricted by a first tightening screw 111.

The first stator 8 and the second stator 28 has a reverse side affixed with piezoelectric ceramics 333 and a front side opposite to the reverse side provided with stator teeth 222, and a second tightening screw 444 is disposed at an inner side of the stator.

A portion of an upper surface of the first mover 9 and the second mover 29 which is in contact with the first stator 8 and the second stator 28 respectively are coated with a wear-resistant material 555, and a lower surface of the first mover 9 and the second mover 29 is pasted with a vibration-absorbing material 666, the wear-resistant material 555 is made of carbon-carbon composite material and the vibration-absorbing material 666 is made of high polymer vibration absorbing material.

The built-in piezoelectric type online dynamic balance actuator is built-in inside an inner hole of the main shaft by transition fit.

The excitation electric power of the piezoelectric ceramics 333 is input from outside through a high-speed slip ring.

Compared with the existing arts, the present invention has the following advantages:

1. The present invention employs the piezoelectric driving technology, which has low running speed and does not need an intermediate reduction transmission mechanism, thereby simplifying the structure, reducing the volume and weight, improving the driving precision while having fast dynamic response, good control performance and the micro-displacement characteristic, which is very suitable for mass position adjustment and positioning control.

2. Since the present invention does not include electromagnetic coil, neither magnetic field nor magnetic field interference is generated, thus electromagnetic pollution is greatly reduced while the reliability of the device of the present invention under a harsh environment is also improved.

3. The present invention is installed in the central shaft hole of the hollow main shaft through a transition fit, and does not interfere with the installation of the grinding wheel or the cutter at the main shaft end, thereby minimizing the influence on the main shaft structure.

DETAILED DESCRIPTION OF THE PREFERRED EMBODIMENT

Figure 1:
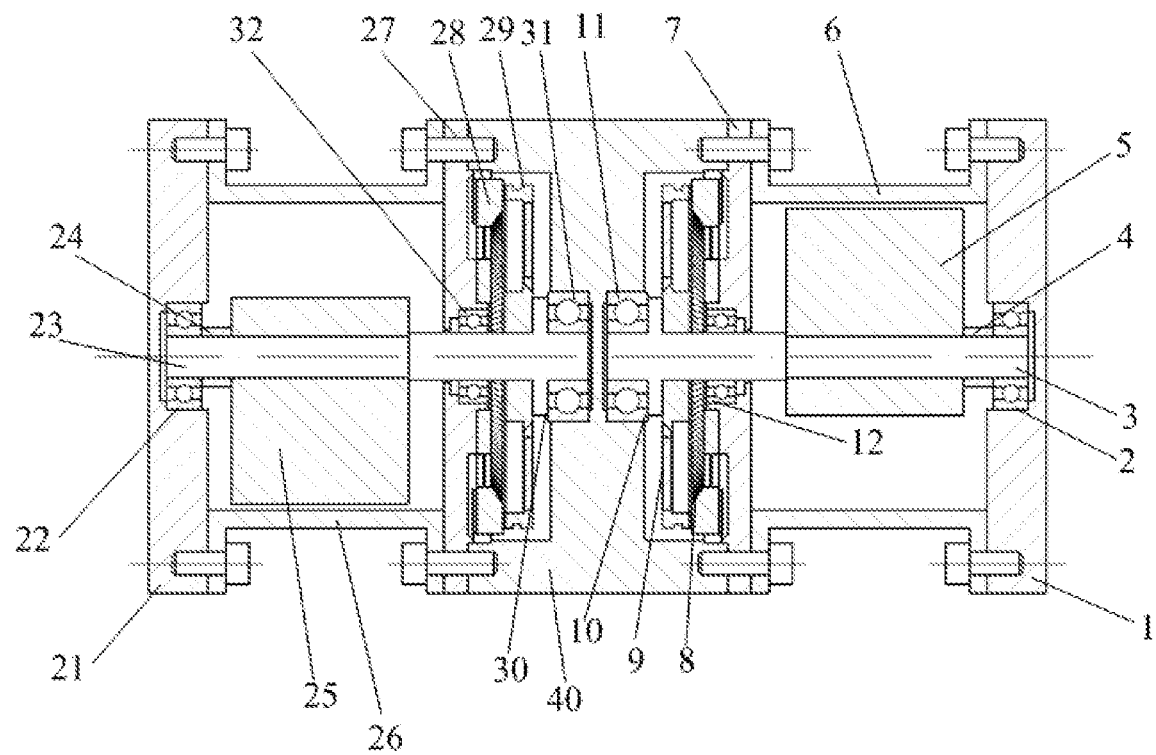
FIG. 1 is a schematic view showing the structure of the present invention.

The present invention is further described in detail with reference to the accompanying drawings and embodiments as follows.

Referring to FIG. 1, FIG. 2, FIG. 3, FIG. 4 and FIG. 5 of the drawings, a built-in piezoelectric type online dynamic balance actuator comprises a housing 40, a left piezoelectric drive adjustment mechanism and a right piezoelectric drive adjustment mechanism connected to two sides of the housing 40. The left piezoelectric drive adjustment mechanism and the right piezoelectric drive adjustment mechanism have the same structure and are completely symmetrical in structure.

The right piezoelectric drive adjustment mechanism includes a right shaft 3. A front end of the right shaft 3 is supported in a right chamber of the housing 40 through a third bearing 11, a middle portion of the right shaft 3 is connected to a right end cover 7 through a second bearing 12, and a rear end of the right shaft 3 is supported on a right bearing housing 1 through a first bearing 2. The right shaft 3 between the right end cover 7 and the right bearing housing 1 is fitted with a right weight mass 5 by means of a transition fit. The right weight mass 5 has one end secured into position by a shoulder of the right shaft 3 and the other end secure into position by a right adjustment sleeve 4. The right adjustment sleeve 4 has two sides biased against the right weight mass 5 and an inner ring of the first bearing 2. The weight mass 5 is disposed inside a right tension sleeve 6. The right tension sleeve 6 has a right side connected to the right bearing housings 1 by bolt connection and a left side connected to the right end cover 7 and the housing 40 by bolt connection. The right end cover 7 has a left side fixedly connected to a first stator 8 by screw thread connection. A first mover 9 is pressed against a surface of the first stator 8 through a disk at the front end of the right shaft 3.

The left piezoelectric drive adjustment mechanism includes a left shaft 23. A rear end of the left shaft 23 is supported in a left chamber of the housing 40 through a sixth bearing 31, a middle portion of the left shaft 23 is connected to a left end cover 27 through a fifth bearing 32, and a front end of the left shaft 23 is supported on a left bearing housing 21 through a fourth bearing 22. The left shaft 23 between the left end cover 27 and the left bearing housing 21 is fitted with a left weight mass 25 by means of a transition fit. The left weight mass 25 has one end secured into position by a shoulder of the left shaft 23 and the other end secure into position by a left adjustment sleeve 24. The left adjustment sleeve 24 has two sides biased against the left weight mass 25 and an inner ring of the fourth bearing 22. The left weight mass 25 is disposed inside a left tension sleeve 26. The left tension sleeve 26 has a left side connected to the left bearing housings 21 by bolt connection and a right side connected to the left end cover 27 and the housing 40 by bolt connection. The left end cover 27 has a right side fixedly connected to a second stator 28 by screw thread connection. A second mover 29 is pressed against a surface of the second stator 28 through a disk at the rear end of the left shaft 23.

The vibration of the first stator 8 and the second stator 28 is generated through exciting the piezoelectric ceramic by the two-phase excitation voltage of a control center. When starting, the right weight mass 5 and the left weight mass 25 are driven by the control center to form a preset angle. With the high-speed operation of the main shaft, the centrifugal force formed by the right weight 5 and the left weight 25 combine to form a balance vector to cancel the imbalance vector of the main shaft, thus improving the mass distribution of the main shaft, and effectively reducing the vibration of the main shaft.

Figure 2:
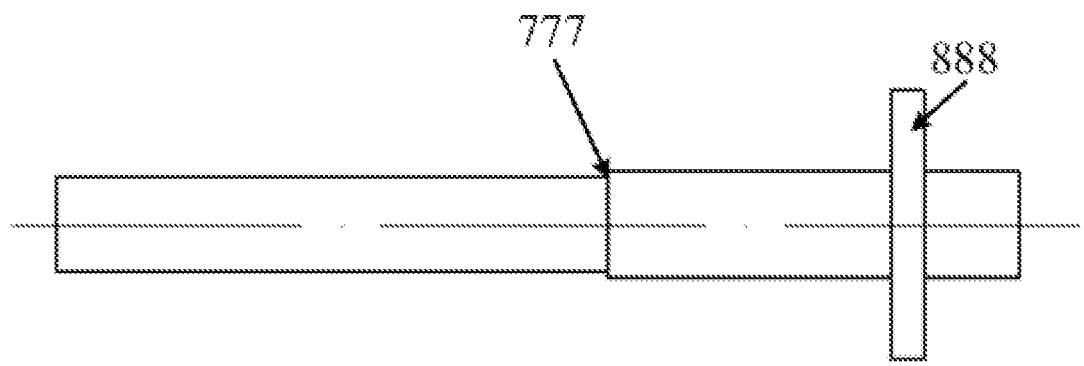
FIG. 2 is a schematic view showing the rotating shaft (left shaft and right shaft) of the present invention.

Referring to FIG. 2 of the drawings, the right shaft 3 and the left shaft 23 are provided with a shoulder 777 and a disc 888. The shoulder 777 realizes positioning for one side of the right weight mass 5 and the left weight mass 25. The disc 888 realizes pressing and preloading of the first mover 9 and the second mover 29.

A first adjusting gasket 10 is disposed at the surface between the left shaft 3 and the third bearing 11 to realize the adjustment of the pre-loading force, and a second adjusting gasket 30 is disposed at the surface between the right shaft 23 and the sixth bearing 31 to realize the adjustment of the pre-loading force.

Figure 3:
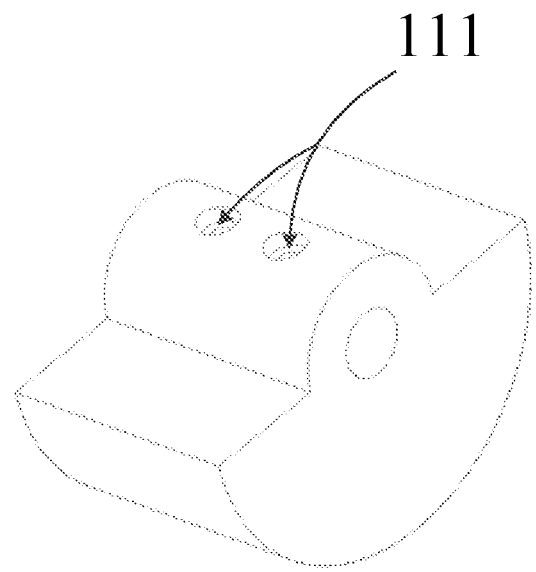
FIG. 3 is a schematic view showing the weight mass of the present invention.

Referring to FIG. 3 of the drawings, the right weight mass 5 and the left weight mass 25 have a semi-circular construction, and the right shaft 3 and the left shaft 23 are connected to the right weight mass 5 and the left weight mass 25 by a transition fit, and a circumferential sliding of the right weight mass 5 and the left weight mass 25 are restricted by a M3 internal hex first tightening screw 111.

Figure 4:
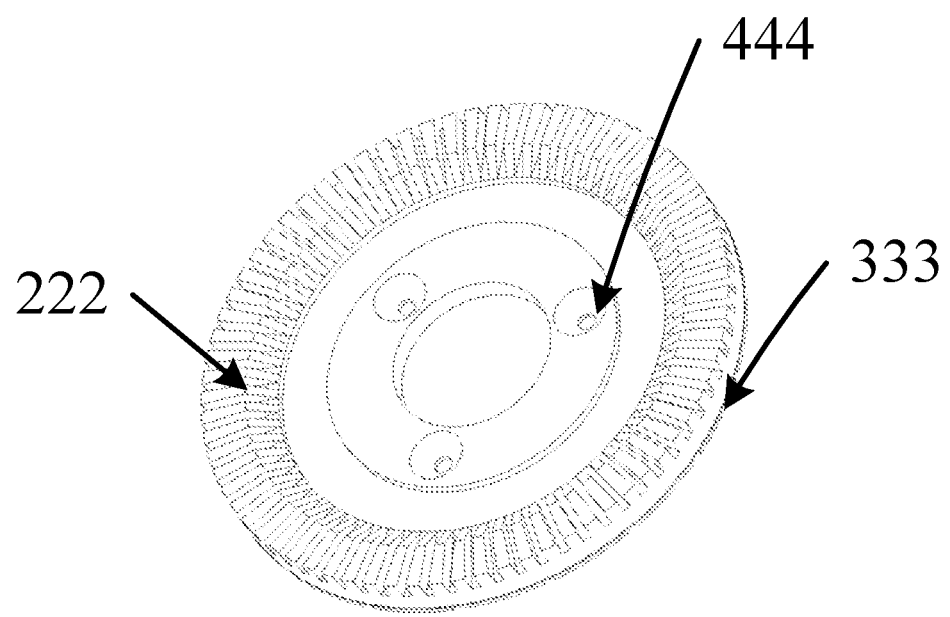
FIG. 4 is a schematic view showing the stator of the present invention.

Referring to FIG. 4 of the drawings, the first stator 8 and the second stator 28 are affixed with piezoelectric ceramics 333 on a reverse side thereof, and are provided with a stator teeth 222 on a front side thereof. Three M3 second tightening screw 444 is provided on an inner side of the stator. The stator teeth 222 can effectively amplify the amplitude to improve the output characteristics of the device.

Figure 5:
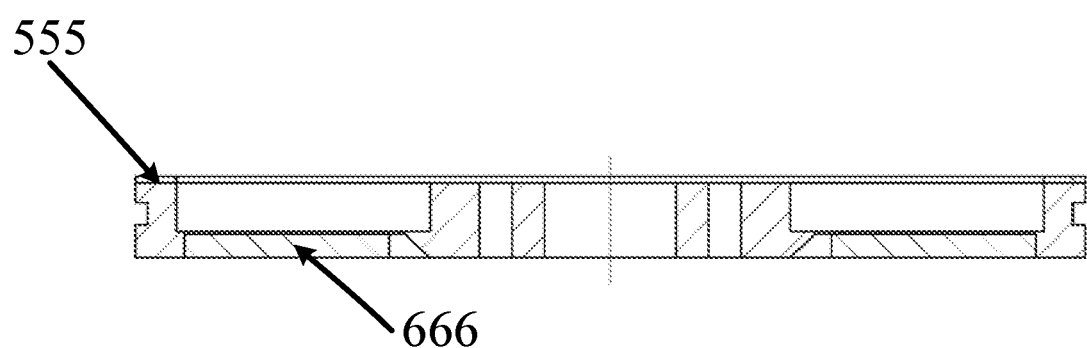
FIG. 5 is a schematic view showing the side view of the structure of the mover of the present invention.

Referring to FIG. 5 of the drawings, the portion between an upper surface of the first mover 9 and the second mover 29 that is in contact with the first stator 8 and the second stator 28 is coated with a wear-resistant material 555, and the lower surface is pasted with a vibration-absorbing material 666. Accordingly, direct friction between the mover and that stator is reduced, wear and tear of the rotor (stator and mover) is reduced, and the service life of the device is increased. The wear-resistant material 555 is made of carbon-carbon composite material, and the vibration-absorbing material 666 is made of high polymer vibration absorbing material.

The built-in piezoelectric-type online dynamic balance actuator is built-in inside the inner hole of the main shaft by a transition fit.

The excitation electric power of the piezoelectric ceramics 333 is input from the outside through a high-speed slip ring.

The specific working principle of the present invention is:

The built-in piezoelectric-type online dynamic balance actuator is built-in in the inner hole of the main shaft by a transition fit. The first bearing housing 1 and the second bearing housing 21 are tightly fitted to the wall of the inner hole of the main shaft to transmit centrifugal force; when the signal detecting portion of the main shaft detects an unbalanced state of the main shaft, the original vibration signal of the main shaft is used to determine the size and orientation of the unbalanced vector through calculation, then an action signal is sent by a control center to the online dynamic balance actuator for action: the excitation voltage excites the first stator 8 to generate vibrational movement, thereby generating a friction driving force under the action of the pre-loading force such that the first mover 9 is driven to rotational movement, then the first mover 9 drives the right shaft 3 to rotational movement, and the right shaft 3 drives the right weight mass 5 thereon to rotate through the corresponding angle. Similarly, the other excitation voltage excites the second stator 28 to generate vibrational movement, thereby driving the second mover 29 to rotational movement. The second mover 29 drives the left shaft 23 to rotational movement, and the left shaft 23 drives the left weight mass 25 thereon to rotate through a calculated angle of the system, so that the right weight mass 5 and the left weight mass 25 are positioned at a fixed position. The main shaft rotates at a high speed, and the two weight masses generate centrifugal force which combine to a balance vector and cancel the imbalance vector of the main shaft. Therefore, the main shaft system reaches the equilibrium state again, and the machining accuracy of the main shaft is quickly improved.

What is claimed is:

1. A built-in piezoelectric type online dynamic balance actuator, comprising a housing (40), characterized in that: the housing (40) has two sides connected to a left piezoelectric drive adjustment mechanism and a right piezoelectric drive adjustment mechanism, said left piezoelectric drive adjustment mechanism and said right piezoelectric drive adjustment mechanism have an identical structure and are completely symmetrical in structure;

wherein said right piezoelectric drive adjustment mechanism comprises:

a right shaft (3) having a front end of said right shaft (3) supported inside a right chamber of said housing (40) through a third bearing (11), a middle portion of the right shaft (3) connected to a right end cover (7) through a second bearing (12), and a rear end of said right shaft (3) supported on a right bearing housing (1) through a first bearing (2);

a right weight mass (5) coupled to said right shaft (3) which is positioned between said right end cover (7) and said right bearing housing (1), said right weight mass (5) having one end secured into position by a shoulder of the right shaft (3) and another end secure into position by a right adjustment sleeve (4);

a right tension sleeve (6) inside which said weight mass (5) is disposed, said right tension sleeve (6) has a right side connected to the right bearing housing (1) by bolt connection and a left side connected to said right end cover (7) and the housing (40) by bolt connection;

a first stator (8) fixedly connected to a left side of said right end cover (7) by screw thread connection; and a first mover (9) pressed against a surface of said first stator (8) through a disk provided at said front end of said right shaft (3), wherein said left piezoelectric drive adjustment mechanism comprises:

a left shaft (23) having a rear end of said left shaft (23) supported inside a left chamber of said housing (40) through a sixth bearing (31), a middle portion of the left shaft (23) connected to a left end cover (27) through a fifth bearing (32), and a front end of said left shaft (23) supported on a left bearing housing (21) through a fourth bearing (22);

a left weight mass (25) coupled to said left shaft (23) which is positioned between said left end cover (27) and said left bearing housing (21), said left weight mass (25) having one end secured into position by a shoulder of the left shaft (23) and another end secure into position by a left adjustment sleeve (24);

a left tension sleeve (26) inside which said weight mass (25) is disposed, said left tension sleeve (26) has a left side connected to the left bearing housing (21) by bolt connection and a right side connected to said left end cover (27) and the housing (40) by bolt connection;

a second stator (28) fixedly connected to a right side of said left end cover (27) by screw thread connection; and a second mover (29) pressed against a surface of said second stator (28) through a disk provided at said rear end of said left shaft (23).

2. The built-in piezoelectric type online dynamic balance actuator according to claim 1, characterized in that: vibration of said first stator (8) and said second stator (28) is generated by piezoelectric ceramic excitation, which is triggered by a two-phase excitation voltage of a control center, said right weight mass (5) and said left weight mass (25) are arranged to be driven by the control center to form a preset angle and then centrifugal force generated by the right weight (5) and the left weight (25) during high speed rotational movement of the main shaft combine to form a balance vector to cancel the imbalance vector of the main shaft so that mass distribution of the main shaft is improved.

3. The built-in piezoelectric type online dynamic balance actuator according to claim 1, characterized in that: each of said right shaft (3) and said left shaft (23) is provided with a shoulder (777) and a disc (888), said shoulder (777) is arranged for positioning one side of said right weight mass (5) and said left weight mass (25), said disc (888) is arranged for pressing against and applying preloading force to said first mover (9) and said second mover (29).

4. The built-in piezoelectric type online dynamic balance actuator according to claim 1, characterized in that: a first adjusting gasket (10) is disposed at a surface between said left shaft (3) and said third bearing (11) for adjustment of the preloading force, and a second adjusting gasket (30) is disposed at a surface between said right shaft (23) and said sixth bearing (31) for adjustment of the preloading force.

5. The built-in piezoelectric type online dynamic balance actuator according to claim 1, characterized in that: each of said right weight mass (5) and said left weight mass (25) has a semi-circular construction, and said right shaft (3) and said left shaft (23) are connected to said right weight mass (5) and said left weight mass (25) by a transition fit respectively.

6. The built-in piezoelectric type online dynamic balance actuator according to claim 1, characterized in that: said first stator (8) and said second stator (28) has a reverse side affixed with piezoelectric ceramics (333) and a front side opposite to said reverse side provided with stator teeth (222), and a second tightening screw (444) is disposed at an inner side of each of said first stator (8) and said second stator (28).

7. The built-in piezoelectric type online dynamic balance actuator according to claim 1, characterized in that: a portion of an upper surface of said first mover (9) and said second mover (29) which is in contact with the first stator (8) and the second stator (28) respectively are coated with a wear-resistant material (555), and a lower surface of said first mover (9) and said second mover (29) is pasted with a vibration-absorbing material (666), said wear-resistant material (555) is made of carbon-carbon composite material and said vibration-absorbing material (666) is made of high polymer vibration absorbing material.

8. The built-in piezoelectric type online dynamic balance actuator according to claim 1, characterized in that: said built-in piezoelectric type online dynamic balance actuator is built-in inside an inner hole of the main shaft by transition fit.

9. The built-in piezoelectric type online dynamic balance actuator according to claim 6, characterized in that: the excitation electric power of the piezoelectric ceramics (333) is input from outside through a high-speed slip ring.

\* \* \* \* \*